(12) United States Patent
Fischer et al.

(10) Patent No.: US 10,777,997 B2
(45) Date of Patent: Sep. 15, 2020

(54) METHOD FOR OPERATING AN ELECTRONIC CIRCUIT BREAKER, AND ELECTRONIC CIRCUIT BREAKER

(71) Applicant: ELLENBERGER & POENSGEN GMBH, Altdorf (DE)

(72) Inventors: Erich Fischer, Altdorf (DE); Guido von der Lieck, Nuremberg (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 345 days.

(21) Appl. No.: 15/892,984

(22) Filed: Feb. 9, 2018

(65) Prior Publication Data

US 2018/0226786 A1 Aug. 9, 2018

(30) Foreign Application Priority Data

Feb. 9, 2017 (DE) .......................... 10 2017 202 103

(51) Int. Cl.
| | |
|---|---|
| *H02H 3/00* | (2006.01) |
| *H02H 3/20* | (2006.01) |
| *H02H 9/02* | (2006.01) |
| *H03K 17/082* | (2006.01) |
| *H02H 1/04* | (2006.01) |
| *H02H 3/24* | (2006.01) |

(52) U.S. Cl.
CPC .............. *H02H 3/20* (2013.01); *H02H 1/043* (2013.01); *H02H 9/025* (2013.01); *H03K 17/082* (2013.01); *H03K 17/0822* (2013.01); *H02H 3/24* (2013.01)

(58) Field of Classification Search
None
See application file for complete search history.

(56) References Cited

U.S. PATENT DOCUMENTS 4,493,002 A * 1/1985 Pelowski ........... H03K 17/0822
307/125
6,356,423 B1 3/2002 Hastings et al.
(Continued)

FOREIGN PATENT DOCUMENTS

| AT | 506092 A4 | 6/2009 |
|---|---|---|
| DE | 3842921 A1 | 6/1990 |

(Continued)

*Primary Examiner* — Stephen W Jackson
(74) *Attorney, Agent, or Firm* — Muncy, Geissler, Olds & Lowe, P.C.

(57) ABSTRACT

A method for operating an electronic circuit breaker having a semiconductor switch that is connected between a voltage input and a load output and that is driven as a function of the output voltage sensed at the load output during the switching on and/or cutting in of a capacitive load, wherein the output voltage is compared with a stored voltage threshold value, wherein when the voltage threshold value is reached or negatively exceeded, a current limit, to which a load current carried by the semiconductor switch is limited, is increased from a nominal value to a first step value increased therefrom, wherein the current limit is reduced stepwise from the first step value to the original nominal value, and wherein the semiconductor switch is opened if the output voltage does not reach the voltage threshold during a triggering time after the stepwise reduction of the current limit.

7 Claims, 4 Drawing Sheets

(56) References Cited

U.S. PATENT DOCUMENTS

| | | | |
|---|---|---|---|
| 6,490,141 B2 | 12/2002 | Fischer et al. | |
| 7,177,129 B2 * | 2/2007 | Arenz | H02H 3/006 |
| | | | 361/93.1 |
| 7,230,813 B1 | 6/2007 | Canova et al. | |
| 7,457,089 B2 | 11/2008 | Ohshima | |
| 8,503,138 B2 * | 8/2013 | Demetriades | H01H 9/542 |
| | | | 361/11 |
| 8,842,403 B2 | 9/2014 | Hummel et al. | |
| 2017/0170654 A1 | 6/2017 | Asanza Maldonado | |

FOREIGN PATENT DOCUMENTS

| | | |
|---|---|---|
| DE | 203 02 275 U1 | 6/2003 |
| DE | 10 2012 103 551 A1 | 10/2013 |
| DE | 10 2014 012 828 A1 | 3/2016 |
| DE | 10 2015 219 545 B3 | 1/2017 |
| EP | 1 150 410 A2 | 10/2001 |
| EP | 1 186 086 A1 | 3/2002 |
| EP | 1 294 069 B1 | 3/2003 |
| EP | 1783886 A2 | 5/2007 |
| JP | H04105512 A | 4/1992 |

\* cited by examiner

METHOD FOR OPERATING AN ELECTRONIC CIRCUIT BREAKER, AND ELECTRONIC CIRCUIT BREAKER

This nonprovisional application claims priority under 35 U.S.C. § 119(a) to German Patent Application No. 10 2017 202 103.9, which was filed in Germany on Feb. 9, 2017, and which is herein incorporated by reference.

BACKGROUND OF THE INVENTION

Field of the Invention

The present invention relates to a method for operating an electronic circuit breaker having a semiconductor switch that is connected between a voltage input and a load output and that is driven during the switching on and/or cutting in of a capacitive load as a function of the output voltage sensed at the load output. The invention additionally relates to an electronic circuit breaker that can be operated according to a method of this type.

Description of the Background Art

An electronic circuit breaker is described in DE 203 02 275 U1, for example, which is incorporated herein by reference. The electronic circuit breaker has a semiconductor switch in the form of a MOSFET (Metal Oxide Semiconductor Field Effect Transistor) that is connected in a current path between an operating voltage terminal (voltage input) and a load terminal. In order to achieve reliable current limiting in a DC network, a measured value sensed by a current sensor in the current path is fed to a comparator input of a control system. When an activation signal is present and a measured value falls below a reference value, the control system drives the semiconductor switch on, whereas in the case of a measured value exceeding the reference value, the control system drives the power transistor off and limits the current flowing through it to the reference value.

Known from EP 1 186 086 B1, which corresponds to U.S. Pat. No. 6,490,141, which is incorporated herein by reference, is a power distribution system in the low voltage range, in particular in the 24V DC range, having a number of circuits, each with an electronic circuit breaker as short circuit protection and/or overload protection. The circuits are supplied collectively by means of a clocked power supply. In the event of an overload, when an adjustable current threshold is exceeded, for example at 1.1 times the nominal current ($I_N$), a blocking of the electronic circuit breaker takes place after a delay period has elapsed, whereas in the event of a short circuit, current limiting takes place first, and then after another current threshold is exceeded (e.g., $2 \times I_N$) a blocking of the circuit breaker takes place after a specific turn-off time has elapsed.

Known from EP 1 150 410 A2, which corresponds to U.S. Pat. No. 6,356,423, is an electronic circuit breaker, driven by means of a microprocessor via a trigger circuit, that disconnects the power supply to a load with a time delay. A partial disconnection of the circuit breaker takes place beforehand or simultaneously.

A partial disconnection of an electronic circuit breaker having multiple circuit blocks, each of which has an electronic switch in the form of a MOSFET and a comparator controlling the latter through a common microprocessor, is also known from EP 1 294 069 B1, which corresponds to U.S. Pat. No. 7,230,813. In the event of an overcurrent, the power supply to the load is disconnected after a time delay that follows a partial disabling of the at least one switch.

For switching capacitive loads in particular and/or for protecting them from overcurrent and short-circuits, the semiconductor switch of the electronic circuit breaker is used as a constant-current source for charging the capacitance. The semiconductor switch, and in particular a MOSFET used here, must be capable of handling the power dissipation resulting from the inrush current during the switching or during the course of charging the capacitance. As a result of this situation, electronic circuit breakers, especially those with active current limiting, are usually designed with an oversized semiconductor switch (MOSFET) in order to adequately take this power dissipation into account. However, such dimensioning of the employed semiconductor switch entails an increased cost and a correspondingly large space requirement within the circuit of the electronic circuit breaker.

A capacitive load is uncharged at the time of turn-on or cut-in, and hence can take on a large number of electrons. Consequently, the resistance of the capacitor is very low at turn-on, as a result of which a high current flow arises that is comparable to a short-circuit current. The high current loading results in a collapse of the output voltage of the circuit breaker. The circuit breaker typically has an adjustable current threshold for the overload case, for example 1.25 or 1.5 times the nominal current, to which the flow of current is limited at turn-on or when the capacitive load is added. This may have the result that the charging time of the capacitive load is longer than the turn-off time (triggering time) of the circuit breaker for a short circuit. This makes it possible for the circuit breaker to trigger, as a result of which the load cannot be reliably turned on. Especially in a circuit with multiple loads, this has the result that other connected loads drop out and/or go into a passive state in the event of a collapse of the output voltage.

DE 10 2014 012 828 A1, which corresponds to US 2017/0170654, which is incorporated herein by reference, describes an electronic circuit breaker with dynamic current limiting during the process of charging a capacitive load. The prior art circuit breaker senses a load or semiconductor current as well as a voltage (source-drain voltage) dropping across a semiconductor switch (MOSFET), with a drive signal for the semiconductor switch being generated therefrom. The power of the semiconductor switch in this case is set to a maximum power value with the aid of the drive signal.

Described in DE 10 2015 219 545 B3 is an electronic circuit breaker having a semiconductor switch and having a control unit connected thereto, which initially brings about a current limiting in the event of an overload or short circuit. To this end, a target value of the output current is set while taking into account a maximum power dissipation of the semiconductor switch.

EP 1 150 410 A2, which corresponds to U.S. Pat. No. 6,356,423, discloses an electronic circuit breaker in which a semiconductor switch and a current sensor are wired in series with a connected load. The circuit breaker also has a control unit in which three current threshold values are stored, wherein the semiconductor switch is driven as a function of threshold comparisons of the stored current threshold values with an output current sensed by the current sensor.

EP 1 186 086 B1, which corresponds to U.S. Pat. No. 6,490,141, which is incorporated herein by reference, describes a power distribution system with a number of circuits, each with a circuit breaker having a semiconductor switch as short circuit protection or overload protection. In this case the semiconductor switch, or each semiconductor switch, includes adjustable current limiting, wherein in the event of an overload a blocking of the semiconductor switch takes place after a first adjustable turn-off time has elapsed when a first adjustable current threshold is exceeded, and wherein in the event of a short circuit a limiting of the current through the semiconductor switch to a second adjustable current threshold and a blocking of the semiconductor switch take place after a second adjustable turn-off time has elapsed.

DE 203 02 275 U1, which is incorporated herein by reference, describes an electronic circuit breaker having a semiconductor switch and having a current sensor connected in series therewith and having a control system for current-limiting driving of the semiconductor switch as a function of a measured value sensed by means of the current sensor. The measured value that is sensed is provided together with a reference value to a comparator of the control system, wherein if the reference value is exceeded by the measured value the semiconductor switch is driven off by the control system and thus the current flowing is limited to the reference value.

DE 10 2012 103 551 B4 discloses an electronic circuit breaker having a switching device that can be controlled by a control unit and having a current sensor and also having a voltage sensor. The control unit here opens the switching device when a short circuit is detected using an output current sensed by the current sensor. The control unit then closes the switching device again when a difference between an output voltage sensed via the voltage sensor after the last opening of the switching device and an output voltage sensed via the voltage sensor before the last opening of the switching device exceeds a stored voltage threshold value.

SUMMARY OF THE INVENTION

It is therefore an object of the present invention to provide. an especially suitable method for operating an electronic circuit breaker. The invention has the additional object of specifying an electronic circuit breaker that can be operated according to such a method.

The method according to the invention is suitable for and is designed for operation of an electronic circuit breaker having a semiconductor switch connected between a voltage input and a load output. The semiconductor switch, implemented as a MOSFET for example, is driven during turn-on and/or cut-in of a capacitive load as a function of an output voltage or load voltage sensed at the load output.

Provision is made according to an exemplary embodiment of the method that the sensed output voltage is compared with a stored voltage threshold value. The voltage threshold value is determined using a difference between a fixed threshold value and an operating voltage sensed between the voltage input and the load output, for example. In one exemplary embodiment the fixed threshold is set at 12V. If an operating voltage of, e.g., 25V is sensed in this case, then the voltage threshold value is set to 25V−12V=13V and is stored for the threshold comparison with the output voltage.

If the output voltage reaches or falls below the voltage threshold value, then a current limit is set from a nominal value to a first step value increased therefrom. A load current (output current) or semiconductor current carried by the semiconductor switch is limited in this case to the applicable current limit during operation.

The nominal value can correspond essentially to a nominal current of the circuit breaker or semiconductor switch, which is to say the magnitude of electric current that the switch draws in order to deliver its nominal power when supplied with the nominal voltage (rated voltage) in normal operation. Consequently, a nominal current is to be understood in particular to mean the rated voltage (DIN-EN 60934), in particular a defined current that may flow continuously through the circuit breaker.

According to the method, the current limit can then be reduced stepwise from the first step value to the original nominal value. The semiconductor switch is opened, which is to say switched to a blocking or electrically nonconducting state, if the output voltage does not reach the voltage threshold during a triggering time after the stepwise reduction of the current limit. This means that the circuit breaker is triggered. If the voltage threshold value is exceeded, then the load voltage or output voltage is in a desired voltage range. In other words, the circuit breaker only triggers if the voltage threshold value is not reached. In this way, an especially suitable method for operating an electronic circuit breaker is achieved.

The method according to the invention thus reacts to the connection of a capacitive load and/or to turn-on with a capacitive load with a temporary increase in the current limiting or of the current limit. The current limiting defined by the current limit is then reduced in a stair-step (stepwise) manner until it reaches the original nominal value. The original nominal value is then retained for the triggering time. The approximately stair-step current limiting thus essentially represents an envelope over the actual current curve during turn-on or addition of the capacitive load. If the output voltage continues to be or is once again below (or equal to) the voltage threshold during the triggering time, then a fault condition, for example a short circuit, is detected, whereupon the circuit breaker triggers and thus disconnects the current path between the voltage input and the load output.

In an embodiment, at least one second step value can be provided between the first step value and the nominal value, to which the current limit is set in the stepwise reduction. In other words, the stepwise current limiting has at least two steps. Preferably, between five and twenty-five steps are provided here. In this way, an especially precise envelope is implemented for the actual current curve during turn-on or addition of the capacitive load. In one suitable improvement, the number of steps and also the relevant associated step values can preferably be set by a user.

In an embodiment, the current limit can be reduced to the next value after an applicable step time. In other words, every step value has an associated step time, wherein a change is made to the next step value or to the nominal value after the applicable step time elapses. This makes possible a simple and useful switchover between the step values during the stepwise reduction of the current limit.

In an embodiment, the individual step values can have step times of equal length or substantially equal length. This means that the same step time is associated with every step value during the stepwise reduction of the current limit. In this way, a suitable dimensioning of the step times is achieved.

An additional or further aspect of the method provides that the triggering time is equal to the sum of the individual step times. This means that the time for the stepwise current limiting is substantially equal to the triggering time.

In an embodiment, the time for the stepwise current limiting and the triggering time are dimensioned using a short-circuit detection time of the electronic circuit breaker. The short-circuit detection time, which is to say the detection or shut-off time in the event of a short circuit before the electronic shutoff or opening of the semiconductor switch, is generally dependent on the nominal value of the load current or on the nominal current. If the short-circuit detection time is 100 ms (milliseconds), for example, then the stepwise current limiting and the triggering time each have, e.g., a time of 50 ms.

In an embodiment, the current limit can be increased to a first step value that is equal to a multiple, in particular a multiple of three, of the nominal value. In this way an especially advantageous dimensioning of the first step value is achieved.

The electronic circuit breaker according to the invention comprises a semiconductor switch that is connected between a voltage input and a load output and is routed on the control side to a controller (control unit).

The controller here is equipped in general—by programming and/or a circuit—for carrying out the above-described method according to the invention. The controller is thus equipped in particular to carry out a threshold comparison of the output voltage and to limit the load current or semiconductor switch current by means of current limiting as well as to increase the current limiting from a nominal value to a first step value and subsequently to reduce it stepwise.

The controller can be implemented, at least at its core, by a microcontroller with a processor and a data memory in which the functionality for carrying out the method according to the invention is implemented by a program in the form of operating software (firmware), so that the method is carried out automatically—in interaction with a user if applicable—when the operating software is executed in the microcontroller.

However, in an embodiment, the controller can be alternatively also implemented within the scope of the invention by programmable electronic components, for example an application-specific integrated circuit (ASIC) in which the functionality for carrying out the method according to the invention is implemented by a circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
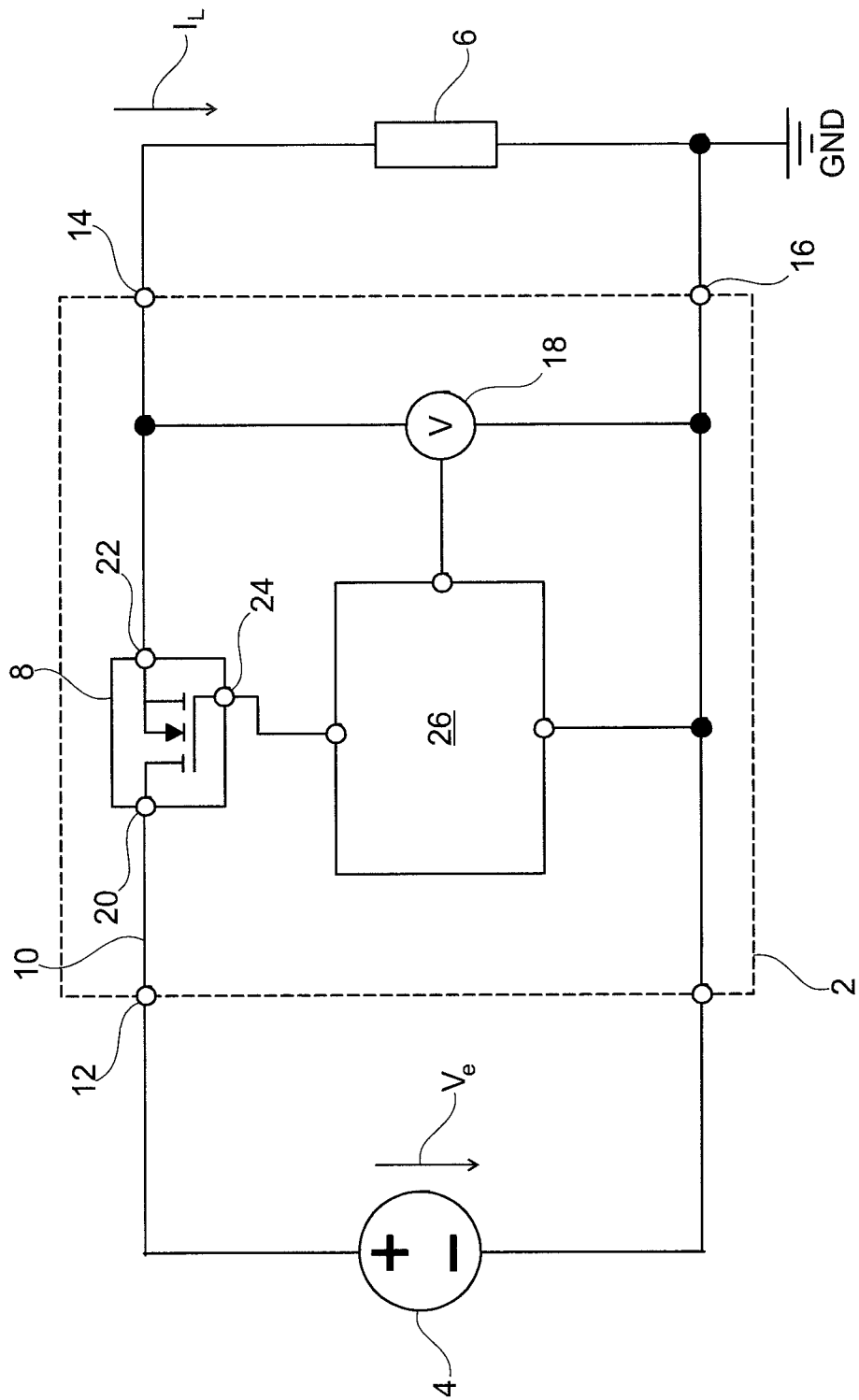
FIG. 1 is a schematic block diagram of an electronic circuit breaker with a semiconductor switch arranged in the positive path of a current controller and with a controller that drives it.

The electronic circuit breaker 2 shown schematically in FIG. 1 is connected in a circuit between a current source or voltage source of a power supply 4 and a capacitive load 6. The circuit breaker 2 includes a power transistor or semiconductor switch 8 in the form of a MOSFET that is connected in a current path 10, namely in the positive path of the electronic circuit breaker 2.

The current path 10 extends between an operating voltage terminal or voltage input 12 and a positive load terminal or load output 14. The positive pole of the load 6 that is to be switched is connected to the load output 14, while a negative pole is to be connected to a corresponding negative load terminal 16 of the circuit breaker 2. This load terminal 16 is routed to ground GND in the exemplary embodiment shown.

The operating or input voltage $V_e$ generated by the current source or voltage source of the power supply 4, for example in the form of a DC voltage at 24 V (DC), is applied to the voltage input 12 of the electronic circuit breaker 2.

With the power supply 4 connected and load 6 connected, in operation of the circuit breaker 2, an output current or load current $I_L$ starting from the voltage input 12 flows through the current path 10, and thus through the drain-source section of the semiconductor switch 8 and through the load 6, to the reference potential or ground GND. The load voltage or output voltage $V_a$ dropping across the load 6 is sensed between the load outputs 14 and 16 by means of a voltage sensor 18 integrated into the circuit breaker 2.

The semiconductor switch 8 is connected into the current path 10 by means of a drain terminal 20 and a source terminal 22. A gate terminal 24 of the semiconductor switch 8 is routed on the drive side to a controller 26 of the circuit breaker 2. The controller 26, implemented as a microcontroller, for example, is coupled by a signal to the voltage sensor 18. During normal operation, the controller 26 limits the load current $I_L$ or the source-drain current flowing through the semiconductor switch 8 by means of current limiting to a current limit $I_g$, which is equal, for example, to a nominal value $I_N$ of a nominal current of the electronic circuit breaker 2.

Figure 2:
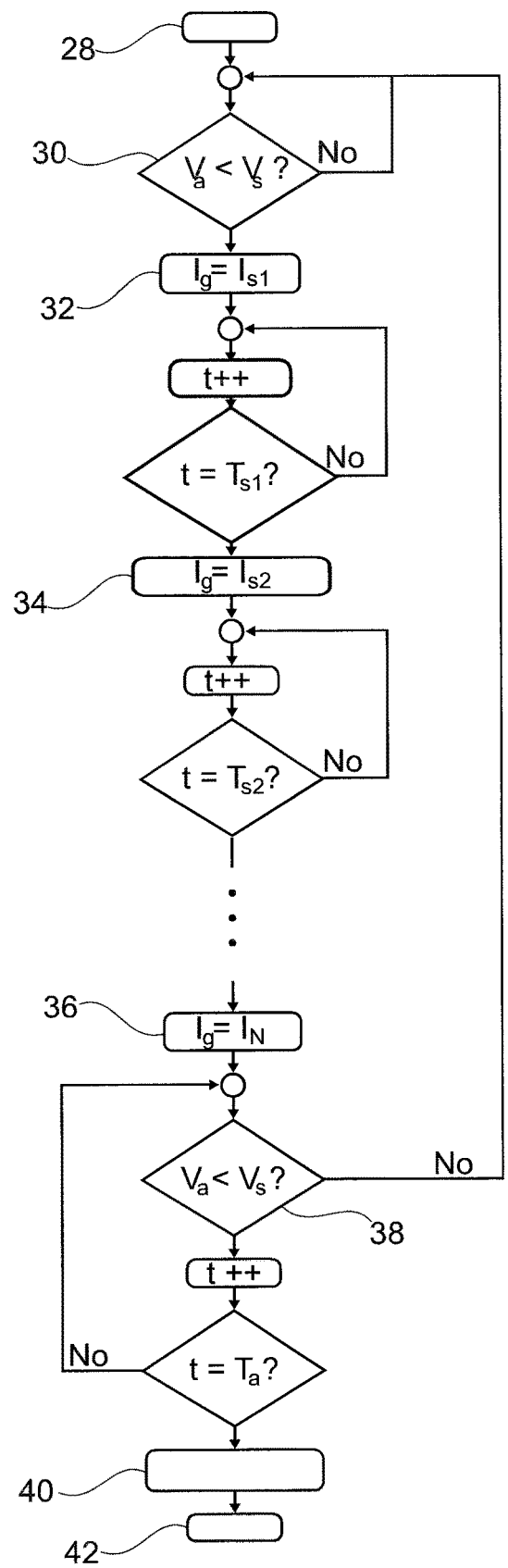
FIG. 2 is a flow chart of the method sequence of the operating method of the electronic protective circuit during a switching on or cutting in of a capacitive load.

An operating method that is appropriate, in particular even in the case of turn-on of the electronic circuit breaker 2 on a capacitive load 6, or in the case of addition of a capacitive load 6, is illustrated in the flow chart shown in FIG. 2. After a start 28, which means for example at the turn-on of the electronic circuit breaker 2, a query or a threshold comparison 30 takes place as to whether the sensed output voltage $V_a$ is less than a stored voltage threshold V.

If the output voltage $V_a$ falls below the voltage threshold $V_s$, the current limit $I_g$ is increased to a first step value $I_{s1}$ in a method step 32. The step value $I_{s1}$ here has a higher value than the original nominal value $I_N$. In particular, the step value $I_{s1}$ is a multiple of the nominal value $I_N$, which is to say, for example, $I_{s1}=a*I_N$, wherein $a=3$ in one possible embodiment. The current limiting of the circuit breaker 2 is subsequently carried out for a step time $T_{s1}$, which means that the load current $I_L$ is limited to the current limit $I_g=I_{s1}$ for the step time $T_{s1}$. To this end, after method step 32 a timer or clock is started that measures a time t and monitors whether the time t has reached the step time $T_{s1}$.

After the step time $T_{s1}$, in a method step 34 the current limit is lowered to a second step value $I_{s2}$. The second step value $I_{s2}$ here is lower than the previous step value $I_{s1}$ and higher than the original nominal value $I_N$. In particular, the step value $I_{s2}$ is a multiple of the nominal value $I_N$, which is to say, e.g., $I_{s2}=b*I_N$, wherein $b=2.65$ in one possible embodiment, for example. Next, a timer is started anew that monitors whether the time t has reached the step time $T_{s2}$.

The current limit $I_g$ is then successively lowered or reduced stepwise until in a method step 36 the current limit $I_g$ is set to the original nominal value $I_N$, thus $I_g=I_N$. In a threshold comparison 38 that follows this, a test is made as to whether the output voltage $V_a$ remains below or has again fallen below the voltage threshold $V_s$. If the output voltage $V_a$ is lower than the voltage threshold value $V_s$, another timer is started for a triggering time $T_a$. During the triggering time $T_a$, a test is repeatedly made as to whether the output voltage $V_a$ is lower than the voltage threshold value $V_s$.

If the output voltage $V_a$ does not exceed the voltage threshold $V_s$ during the triggering time $T_a$, the circuit breaker 2 is triggered in a method step 40. To this end, the semiconductor switch 8 is opened or switched to a blocking state by the controller 26. The method is then ended in a method step 42.

The action of the above-described method is explained in detail below on the basis of FIGS. 3 to 6.

Figure 3:
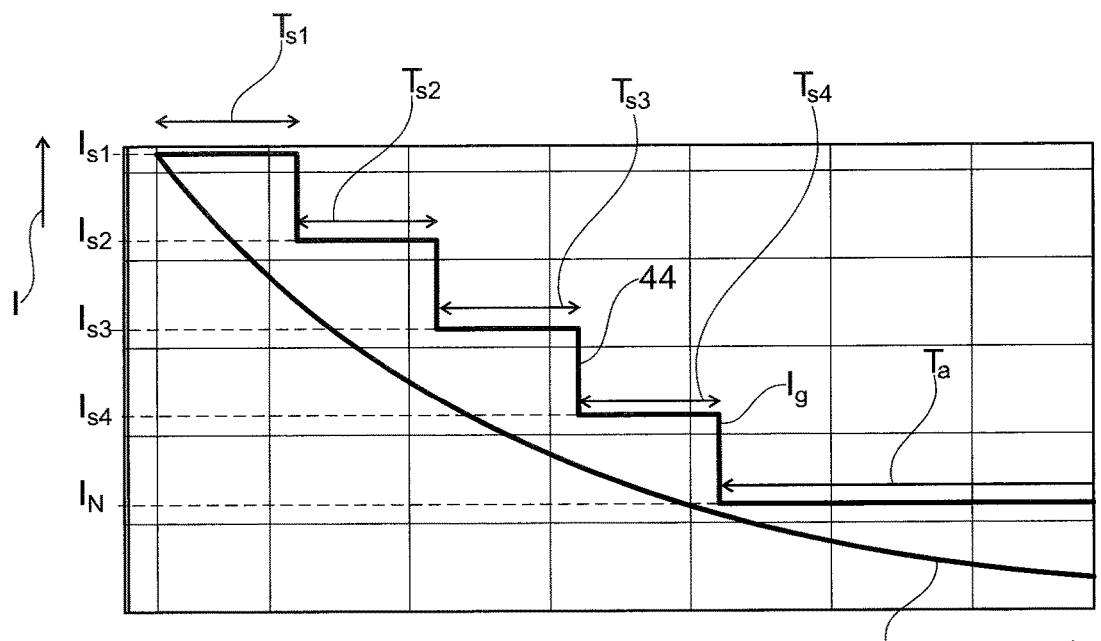
FIG. 3 is a diagram of current vs. time, the curve of a charging current of the capacitive load during a stepwise current limiting of the circuit breaker.

FIG. 3 shows, in a diagram of current vs. time, a schematic curve of the charging current $I_L$ of the capacitive load 6 during a turn-on process with a stair-step current limiting of the circuit breaker 2. The time t is plotted along the horizontal abscissa axis (x-axis). The current I is plotted along the vertical ordinate axis (y-axis).

The capacitive load 6 is uncharged at the time of turn-on or cut-in, and hence can take on a large number of electrons. Consequently, the resistance of the capacitive load 6 at turn-on is very low, as a result of which a high current arises that is comparable to a short-circuit current. The high current loading results in a collapse of the output voltage $V_a$ of the circuit breaker 2. As a result, in the method step 30 the output voltage $V_a$ drops below the voltage threshold $V_s$, so the current limiting is raised to the step value $I_{s1}$ by means of the current limit $I_g$.

In this exemplary embodiment, after the step time $T_{s1}$ the current limit $I_g$ is then lowered or reduced in a stair-step or stepwise manner to a step value $I_{s2}$ for a step time $T_{s2}$ and to a step value $I_{s3}$ for a step time $T_{s3}$ and to a step value $I_{s4}$ for a step time $T_{s4}$. After the step time $T_{s4}$, the current limit $I_g$ is finally set to the nominal value $I_N$. The original nominal value $I_N$ is then maintained for the triggering time $T_a$. The resulting stair-step current limiting 44 substantially represents—as can be seen comparatively clearly in FIG. 3—an envelope over the actual current curve of the load current $I_L$ during turn-on or addition of the capacitive load 6. In this embodiment, the step times $T_{s1}$, $T_{s2}$, $T_{s3}$ and $T_{s4}$ preferably are all dimensioned to be of equal length.

Figure 4:
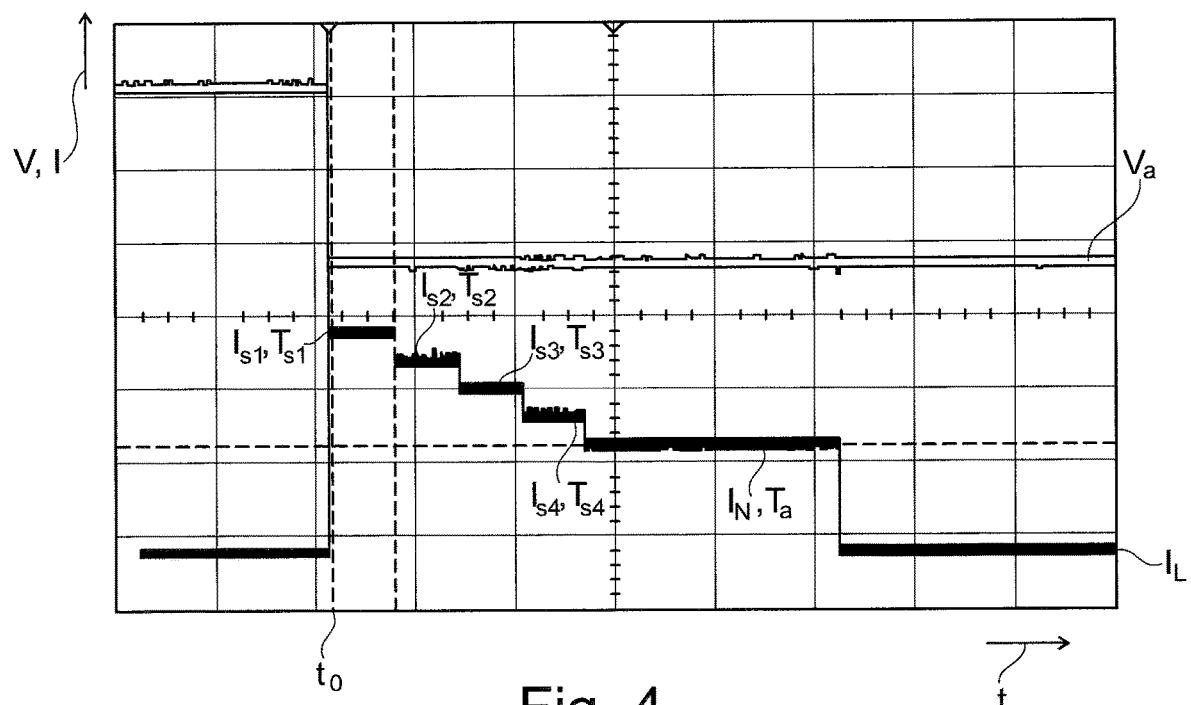
FIG. 4 is a diagram of current and voltage vs. time, the curve of an output voltage and a load current, limited by the current limiting, of the circuit breaker in the event of a continuing overload current.

The exemplary embodiment from FIG. 4 shows, in a diagram of current and voltage vs. time, a curve of the load current $I_L$ of the capacitive load 6 and a curve of the output voltage $V_a$ in the event of a fault. The time t is plotted here along the horizontal abscissa axis (x-axis). The current I and the voltage U are plotted along the vertical ordinate axis (y-axis).

In this exemplary embodiment, the circuit breaker has a nominal current of approximately 2 A (amperes). At a point in time $t_0$, the circuit breaker 2 is loaded with a current I of approximately 8 A. This causes a collapse of the output voltage $V_a$. As a result, the current limit $I_g$ is set to the step value $I_{s1}$ for the step time $T_{s1}$. The first step value $I_{s1}$ in this exemplary embodiment has a value of 6 A. In the exemplary embodiment, the current switch 2 is continuously loaded with the 8 A, so the current limiting to the step value $T_{s1}$ is not sufficient to raise the output voltage $V_a$ again. After the step time $T_{s1}$, which is dimensioned at 122 ms, for example, the current limit $I_g$ is reduced to the step value $I_{s2}$ of approximately 5.3 A. Next, the current limit is reduced to the step value $I_{s3}$ of approximately 4.5 A, and the step value $I_{s4}$ 3.7 A is reduced stepwise to the nominal value $I_N$, which in this exemplary embodiment is dimensioned at 2.8 A. The nominal value $I_N$ is maintained during the triggering time $T_a$ of approximately 500 ms, and it is tested whether the output voltage $V_a$ continues to be below the voltage threshold V. Since the output voltage $V_a$ is still collapsed after the triggering time $T_a$, the circuit breaker 2 then triggers.

Figure 5:
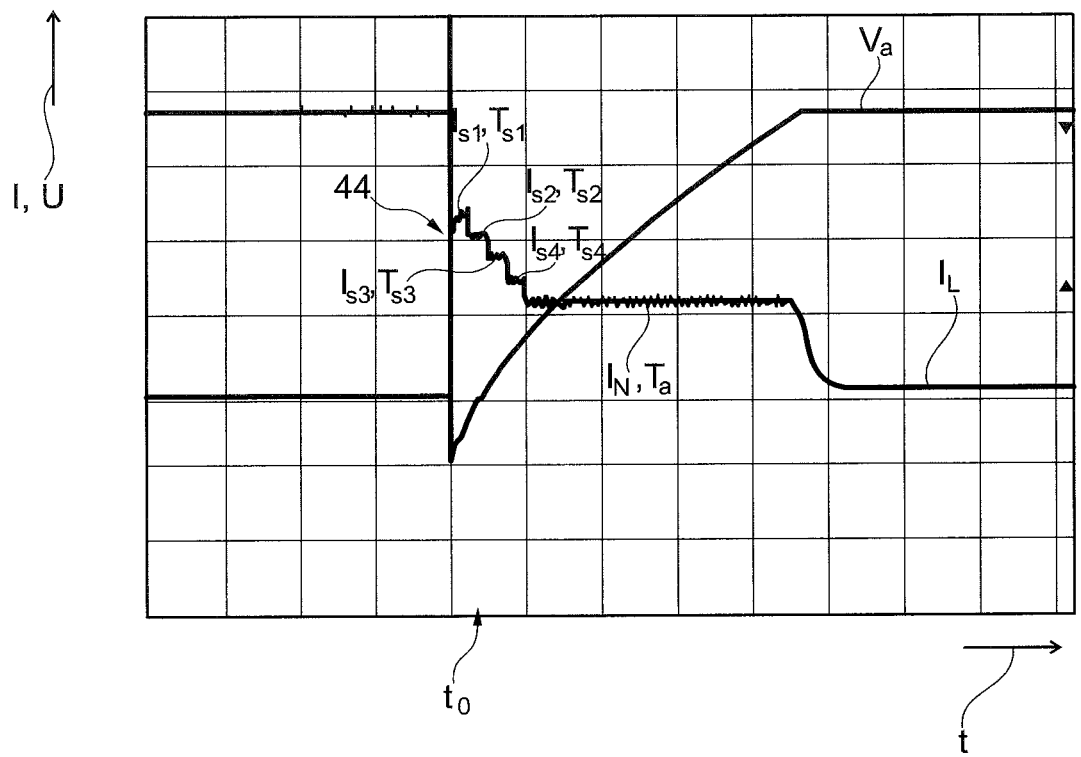
FIG. 5 is a diagram of current and voltage vs. time, the curve of the output voltage and the load current of the circuit breaker during a turn-on process of the capacitive load in which the circuit breaker is not triggered.

In the exemplary embodiment from FIG. 5, a curve of the load current $I_L$ of the capacitive load 6 and a curve of the output voltage $V_a$ are shown in a diagram of current and voltage vs. time in the event of an addition of the capacitive load 6.

In the exemplary embodiment from FIG. 5, the circuit breaker 2 has a nominal value of 4 A and is loaded with a base load of approximately 2.4 A. At the point in time $t_0$ a capacitance of 43000 µF is added as a load 6. The output voltage $V_a$ initially collapses, as a result of which the stair-step current limiting 44 is initiated. Since the output voltage $V_a$ is sufficiently reestablished during the triggering time $T_a$, and thus exceeds the voltage threshold $V_s$, the circuit breaker 2 does not trigger, so the load 6 was added without causing other loads in the circuit to be switched off or changed to a passive state.

Figure 6:
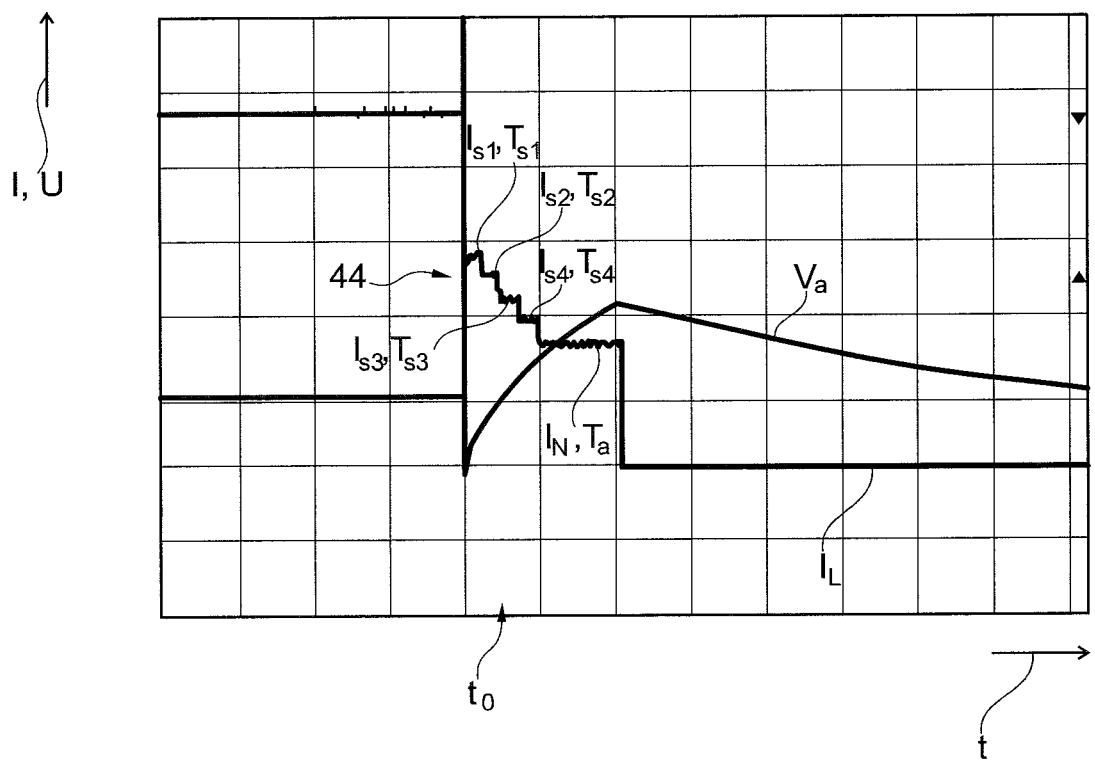
FIG. 6 is a diagram of current and voltage vs. time, the curve of the output voltage and the load current of the circuit breaker during a turn-on process of the capacitive load in which the circuit breaker is triggered.

In the exemplary embodiment from FIG. 6, the triggering time $T_a$ is approximately equal to the time of the stair-step current limiting 44. In this embodiment the circuit breaker 2 has a nominal value of 3 A and is loaded with a base load of approximately 2.4 A. At the point in time $t_0$ a capacitance of 43000 µF is added as a load 6. The output voltage $V_a$ initially collapses, as a result of which the stair-step current limiting 44 is initiated. Since the output voltage $V_a$ is not sufficiently reestablished during the triggering time $T_a$, and thus does not exceed the voltage threshold $V_s$, the circuit breaker 2 triggers.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for operating an electronic circuit breaker having a semiconductor switch that is connected between a voltage input and a load output and that is driven during the switching on and/or cutting in of a capacitive load as a function of the output voltage sensed at the load output, the method comprising:
   comparing the output voltage with a stored voltage threshold value;

increasing, when the threshold value is reached or negatively exceeded, a current limit to which a load current carried by the semiconductor switch is limited from a nominal value to a first step value increased therefrom;

reducing stepwise the current limit from the first step value to the original nominal value; and opening the semiconductor switch if the output voltage does not reach the voltage threshold during a triggering time after the stepwise reduction of the current limit.

2. The method according to claim 1, wherein at least one second step value, to which the current limit is set in the stepwise reduction, is provided between the first step value and the nominal value.

3. The method according to claim 1, wherein the current limit is reduced to the next value after an applicable step time.

4. The method according to claim 3, further comprising equal-length step times of the individual step values.

5. The method according to claim 3, further comprising a triggering time that is equal to the sum of the individual step times.

6. The method according to claim 1, wherein the current limit is increased to a first step value that is equal to a multiple or a multiple of three of the nominal value.

7. An electronic circuit breaker comprising a semiconductor switch that is connected between a voltage input and a load output and is routed on the control side to a controller that is provided and equipped for carrying out the method according to claim 1.

* * * * *